United States Patent
Freriks et al.

(10) Patent No.: US 7,495,239 B2
(45) Date of Patent: *Feb. 24, 2009

(54) METHOD FOR CLEANING A LITHOGRAPHIC APPARATUS MODULE, A CLEANING ARRANGEMENT AND A LITHOGRAPHIC APPARATUS COMPRISING THE CLEANING ARRANGEMENT

(75) Inventors: Johannes Maria Freriks, Veldhoven (NL); Vadim Yevgenyevich Banine, Helmond (NL); Vladimir Vitalevitch Ivanov, Moscow (RU)

(73) Assignee: ASML Netherlands B.V., Veldhoven (NL)

(*) Notice: Subject to any disclaimer, the term of this patent is extended or adjusted under 35 U.S.C. 154(b) by 238 days.

This patent is subject to a terminal disclaimer.

(21) Appl. No.: 11/314,099

(22) Filed: Dec. 22, 2005

(65) Prior Publication Data

US 2007/0145296 A1    Jun. 28, 2007

(51) Int. Cl.
*G03F 7/20* (2006.01)
*G21G 5/00* (2006.01)
*A61N 5/00* (2006.01)
*C23F 1/00* (2006.01)
*C25F 1/00* (2006.01)
*H05H 1/00* (2006.01)
*H05H 1/24* (2006.01)

(52) U.S. Cl. ............. 250/492.2; 250/492.1; 250/504 R; 250/372; 216/67; 216/76; 216/81; 156/345.29; 156/345.35; 134/1.1; 117/97; 117/103; 117/105; 117/108; 427/533; 427/534; 427/569; 427/595; 257/E21.245; 257/E21.252; 257/E21.256

(58) Field of Classification Search ............. 250/504 R, 250/492.1, 492.2, 492.3, 493.1, 370.09, 372; 216/58, 64, 67, 72, 74–81; 438/689, 706, 438/708, 725, 745, 906, 947, 948; 156/345.26, 156/345.29, 345.35, 345.33, 345.38, 345.4; 134/1, 1.1, 1.2, 11, 20, 26, 39, 104.1, 201, 134/902; 117/90–94, 97, 103, 105, 108; 427/307, 533, 534, 558, 569, 595, 596; 257/184, 257/E21.001, E21.002, E21.03, E21.031, 257/E21.032, E21.241, E21.245, E21.252, 257/E21.254, E21.256

See application file for complete search history.

(56) References Cited

U.S. PATENT DOCUMENTS 4,665,315 A * 5/1987 Bacchetti et al. .......... 250/492.1

(Continued)

OTHER PUBLICATIONS

Wikipedia "Degree of Ionization" <http://en.wikipedia.org/wiki/Degree_of_ionization>.*

(Continued)

*Primary Examiner*—Bernard E Souw
(74) *Attorney, Agent, or Firm*—Sterne, Kessler, Goldstein & Fox P.L.L.C.

(57) ABSTRACT

A cleaning arrangement for a lithographic apparatus module may be provided in a collector. The cleaning arrangement includes a hydrogen radical source configured to provide a hydrogen radical containing gas to at least part of the module and a pump configured to pump gas through the module such that a flow speed of the hydrogen radical containing gas provided through at least part of the module is at least 1 m/s. The cleaning arrangement may also include a gas shutter configured to modulate a flow of the hydrogen radical containing gas to at least part of the module, a buffer volume of at least 1 m$^3$ in communication with the module, and a pump configured to provide a gas pressure in the buffer volume between 0.001 mbar (0.1 Pa) and 1 mbar (100 Pa).

37 Claims, 6 Drawing Sheets

U.S. PATENT DOCUMENTS

| | | | | |
|---|---|---|---|---|
| 4,987,008 | A | * | 1/1991 | Yamazaki et al. ............ 438/694 |
| 5,242,538 | A | * | 9/1993 | Hamrah et al. ................ 216/66 |
| 5,508,554 | A | * | 4/1996 | Takatani et al. ............. 257/617 |
| 5,569,075 | A | * | 10/1996 | Leturmy ...................... 454/66 |
| 5,612,588 | A | * | 3/1997 | Wakalopulos ............... 313/420 |
| 5,762,706 | A | * | 6/1998 | Saito et al. .................. 117/105 |
| 5,885,361 | A | * | 3/1999 | Kikuchi et al. ............... 134/1.1 |
| 5,945,690 | A | * | 8/1999 | Saito et al. .................... 257/94 |
| 6,007,671 | A | * | 12/1999 | Fujimura et al. ....... 156/345.27 |
| 6,036,581 | A | * | 3/2000 | Aoki ........................... 451/39 |
| 6,107,192 | A | * | 8/2000 | Subrahmanyan et al. .... 438/637 |
| 6,107,197 | A | * | 8/2000 | Suzuki ........................ 438/677 |
| 6,359,969 | B1 | * | 3/2002 | Shmaenok ................. 378/156 |
| 6,551,915 | B2 | * | 4/2003 | Lin et al. .................... 438/598 |
| 6,878,419 | B2 | * | 4/2005 | David et al. ................. 427/535 |
| 6,894,298 | B2 | * | 5/2005 | Ahmad et al. ........... 250/504 R |
| 6,913,994 | B2 | * | 7/2005 | Guo et al. ................... 438/638 |
| 7,196,342 | B2 | * | 3/2007 | Ershov et al. ........... 250/504 R |
| 7,205,164 | B1 | * | 4/2007 | Geha et al. ..................... 438/3 |
| 2003/0190012 | A1 | * | 10/2003 | Ahmad ....................... 378/119 |
| 2004/0043544 | A1 | * | 3/2004 | Asai et al. ................... 438/149 |
| 2004/0183038 | A1 | * | 9/2004 | Hiramoto et al. ........ 250/504 R |
| 2004/0221876 | A1 | * | 11/2004 | Waleh et al. .................. 134/30 |
| 2005/0208756 | A1 | * | 9/2005 | Matsushita et al. .......... 438/622 |
| 2005/0208768 | A1 | * | 9/2005 | Finlay et al. ................ 438/689 |
| 2006/0115771 | A1 | * | 6/2006 | Wilhelmus Van Herpen et al. .......................... 430/311 |
| 2006/0121733 | A1 | * | 6/2006 | Kilpela et al. ................ 438/681 |
| 2006/0148243 | A1 | * | 7/2006 | Wang ......................... 438/638 |
| 2006/0163500 | A1 | * | 7/2006 | Inoue et al. ............... 250/493.1 |
| 2006/0175558 | A1 | * | 8/2006 | Bakker et al. ............ 250/492.2 |
| 2006/0278833 | A1 | | 12/2006 | Van Herpen et al. |
| 2007/0062557 | A1 | * | 3/2007 | Rakhimova et al. .......... 134/1.1 |
| 2007/0069160 | A1 | * | 3/2007 | Banine et al. ............ 250/504 R |
| 2007/0069162 | A1 | | 3/2007 | Banine et al. |
| 2007/0125964 | A1 | * | 6/2007 | Van Herpen et al. ..... 250/492.2 |
| 2007/0131878 | A1 | * | 6/2007 | Banine et al. ............. 250/492.2 |
| 2007/0145296 | A1 | * | 6/2007 | Freriks et al. ............ 250/492.2 |
| 2007/0145297 | A1 | * | 6/2007 | Freriks et al. ............ 250/492.2 |
| 2007/0209677 | A1 | * | 9/2007 | Kitazoe et al. .................. 134/1 |
| 2008/0001101 | A1 | | 1/2008 | Van Herpen et al. |
| 2008/0011967 | A1 | | 1/2008 | Van Herpen et al. |
| 2008/0093023 | A1 | * | 4/2008 | Tomita et al. .......... 156/345.26 |
| 2008/0142736 | A1 | | 6/2008 | Wassink et al. |
| 2008/0142741 | A1 | | 6/2008 | Van Herpen et al. |

OTHER PUBLICATIONS

"HydrogenMolecule"<http://hyperphysics.phy-astr.gsu.edu/hbase/molecule/hmole.html>.*

Notice of Allowance for U.S. Appl. No. 11/444,535, issued Aug. 25, 2008 by USPTO, 10 pgs.

Office Action for U.S. Appl. No. 11/444,535, issued Mar. 31, 2008 by USPTO, 20 pgs.

* cited by examiner

METHOD FOR CLEANING A LITHOGRAPHIC APPARATUS MODULE, A CLEANING ARRANGEMENT AND A LITHOGRAPHIC APPARATUS COMPRISING THE CLEANING ARRANGEMENT

BACKGROUND OF THE INVENTION

1. Field of the Invention

The present invention relates to a method for cleaning a lithographic apparatus module. The present invention further relates to a cleaning arrangement for a lithographic apparatus module and to a lithographic apparatus including the cleaning arrangement.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the production of fast ions and atoms, which are expelled from the plasma in all directions. These particles can be damaging to the collector and condenser mirrors which are generally multilayer mirrors or grazing incidence mirrors, with fragile surfaces. This surface is gradually degraded due to the impact, or sputtering, of the particles expelled from the plasma and the lifetime of the mirrors is thus decreased. The sputtering effect is particularly problematic for the radiation collector. The purpose of this mirror is to collect radiation which is emitted in all directions by the plasma source and direct it towards other mirrors in the illumination system. The radiation collector is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

In the near future, extreme ultraviolet (EUV) sources will probably use tin or another metal vapor to produce EUV radiation. This tin may leak into the lithographic apparatus, and will be deposited on mirrors in the lithographic apparatus, e.g. the mirrors of the radiation collector (also called collector). The mirrors of such a radiation collector may have a EUV reflecting top layer of, for example, ruthenium (Ru). Deposition of more than approximately 10 nm tin (Sn) on the reflecting Ru layer will reflect EUV radiation in the same way as bulk Sn. It is envisaged that a layer of a few nm Sn is deposited very quickly near a Sn-based EUV source. The overall transmission of the collector may decrease significantly, since the reflection coefficient of tin is much lower than the reflection coefficient of ruthenium. In order to prevent debris from the source or secondary particles generated by this debris from depositing on the radiation collector, contaminant barriers may be used. Though such contaminant barriers may remove part of the debris, still some debris will deposit on the radiation collector or other optical elements. Further, also carbon may deposit on optical elements like mirrors, which may also lead to a decrease in optical properties like reflection, etc.

SUMMARY OF THE INVENTION

It is desirable to provide a cleaning method for cleaning the collector (also called radiation collector or collector mirror) and to provide a cleaning arrangement designed to perform such a method. It is further desirable to provide a lithographic apparatus including such cleaning arrangement.

According to an aspect of the invention, there is provided a cleaning arrangement for a lithographic apparatus module including a) a hydrogen radical source configured to provide a hydrogen radical containing gas to at least part of the module and b) a pump configured to pump gas through the module such that a flow speed of the hydrogen radical containing gas provided through at least part of the module is at least 1 m/s. According to a further aspect of the invention, there is provided another cleaning arrangement for a lithographic apparatus module including a) a hydrogen radical source configured to provide a hydrogen radical containing gas to at least part of the module, b) a gas shutter configured to modulate a flow of the hydrogen radical containing gas to at least part of the module, c) a buffer volume of at least 1 m$^3$ in communication with the module, and d) a pump configured to provide a gas pressure in the buffer volume between 0.001 mbar (0.1 Pa) and 1 mbar (100 Pa).

According to another aspect of the invention, a lithographic apparatus including the cleaning arrangement according to the invention is provided.

According to an aspect of the invention, a method for cleaning a lithographic apparatus module includes a) leading a hydrogen radical containing gas flow through at least part of the module with a flow speed of at least 1 m/s, and b) maintaining in the module a gas atmosphere having a gas pressure between 1 mbar (100 Pa) and 1000 mbar (100,000 Pa), for a predetermined time is provided. According to yet another aspect of the invention, another method for cleaning a lithographic apparatus module includes a) pressurizing a buffer volume of at least 1 m$^3$ in communication with the module at a gas pressure between 0.001 mbar (0.1 Pa) and 1 mbar (100 Pa), b) providing a hydrogen radical containing gas to at least part of the module and c) maintaining in the module the gas pressure between 0.001 mbar (0.1 Pa) and 1000 mbar (100,000 Pa) for a predetermined time is provided.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
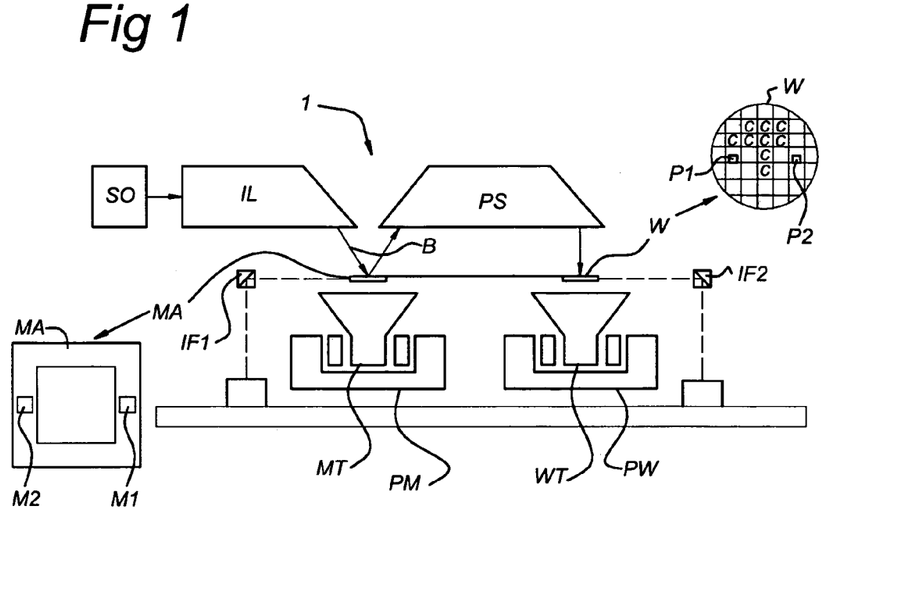
FIG. 1 schematically depicts a lithographic apparatus according to an embodiment of the invention.

FIG. 1 schematically depicts a lithographic apparatus 1 according to one embodiment of the invention. The apparatus 1 includes an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an embodiment according to the invention, there is provided a lithographic apparatus including an illumination system configured to condition a radiation beam; a support configured to support a patterning device, the patterning device being configured to impart the radiation beam with a pattern in its cross-section to form a patterned radiation beam; a substrate table configured to hold a substrate; a projection system configured to project the patterned radiation beam onto a target portion of the substrate, and a cleaning arrangement according to the invention.

The term "halogen containing gas" or "hydrogen containing gas" refers to gasses or gas mixtures including at least a halogen gas or hydrogen gas, respectively. The term "halogen" in the term "halogen containing gas" refers to at least one or more selected of F, Cl, Br and I, either as an atom (radical) or as compound, for example $F_2$, $Cl_2$, $Br_2$, $I_2$, HF, HCl, HBr, HI, interhalogen compounds, for example $ClF_3$, or other compounds including one or more selected from F, Cl, Br and I which can be brought into the gas phase at a temperature between about 50-500°. In an embodiment one or more of $F_2$, $Cl_2$, $Br_2$, $I_2$ may be used, in particular $I_2$. The terms "hydrogen" and "hydrogen radicals" include their isotopes as well, in particular, deuterium. Hence, the term "hydrogen containing gas" refers to a gas including $H_2$ or deuterium or tritium analogues thereof. In an embodiment, the hydrogen containing gas includes one or more selected from the group of $H_2$, HD, $D_2$, HT, DT, $T_2$. A halogen containing gas or a hydrogen containing gas may further include additional components like buffer gasses, such as Ar, etc. A "flow of hydrogen radicals" refers to a gas flow, wherein in the gas also hydrogen radicals are present. Usually, such a gas will also contain hydrogen molecules (like one or more of $H_2$, HD, $D_2$, HT, DT, $T_2$), since not all hydrogen may be converted into radicals, and due to radical recombination. The term "hydrogen radical containing gas" refers to a gas including hydrogen radicals or deuterium or tritium analogues thereof. Such gas may further include other components like $H_2$, etc., which has not been dissociated or has recombined from hydrogen radicals.

The term "lens", where the context allows, may refer to any one or combination of various types of optical components, including refractive, reflective, magnetic, electromagnetic and electrostatic optical components.

The terms "radiation" and "beam" used herein encompass all types of electromagnetic radiation, including ultraviolet (UV) radiation (e.g. having a wavelength λ of 365, 248, 193, 157 or 126 nm) and extreme ultra-violet (EUV or soft X-ray) radiation (e.g. having a wavelength in the range of 5-20 nm, e.g. 13.5 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. It should be appreciated that radiation having a wavelength in the range of, for example, 5-20 nm relates to radiation with a certain wavelength band, of which at least part is in the range of 5-20 nm.

The terms "cleaning arrangement" and "method for cleaning" refer to an arrangement and a method that may be used in a cleaning process. As mentioned below, providing hydrogen radicals may be used for reduction of oxides, like Sn oxides and in a next process, halogens (like for example $I_2$) may remove the metal, like Sn, by the formation of halides. Hence, "cleaning" in this context may imply a complete or partial removal of undesired deposition but may also imply a part of a cleaning process, like a reduction (without substantially removing deposition). Therefore, the term cleaning also includes treating with a gas in the course of a cleaning of a cleaning process. Further, in an embodiment hydrogen radicals may nevertheless be used to remove deposition. The cleaning process may also be used to remove at least partially C (carbon) deposition.

The term "in communication" especially refers to gaseous communication, i.e. that gas may be transferred from one volume to another volume since these volumes are in communication. This term does not exclude the presence of a gas shutter between the volumes that may be used to interrupt the gas communication between the volumes.

Figure 2:
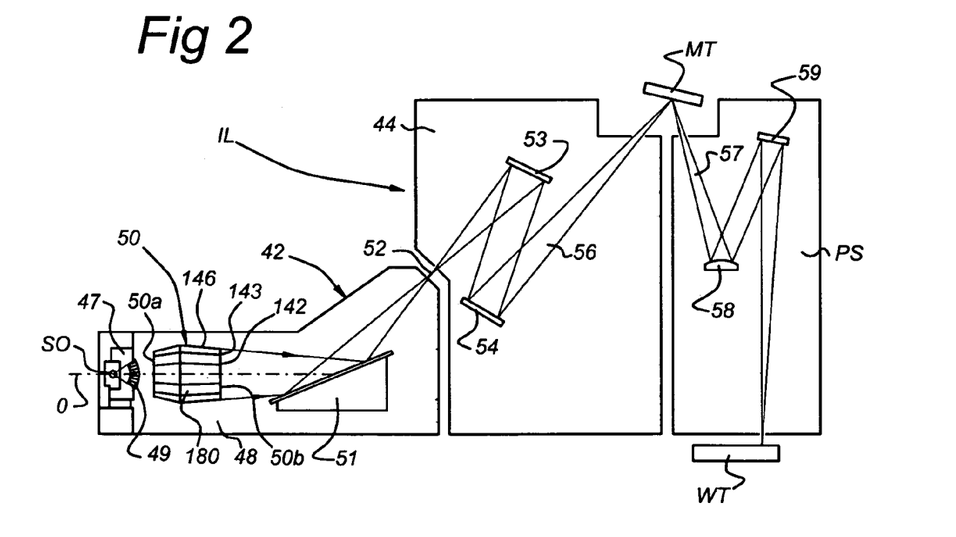
FIG. 2 schematically depicts a side view of an EUV illumination system and projection optics of a lithographic apparatus according to FIG. 1.

FIG. 2 shows the projection apparatus 1 in more detail, including a radiation system 42, an illumination optics unit 44, and the projection system PS. The radiation system 42 includes the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 which is positioned in or behind an opening in source chamber 47. The gas barrier 49 may include a channel structure.

The collector chamber 48 includes a radiation collector 50 (also called collector mirror or collector) which may be formed by a grazing incidence collector. Radiation collector 50 has an upstream radiation collector side 50a and a downstream radiation collector side 50b. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the figures, for example there may be 1-4 more reflective elements present than 58, 59. Radiation collectors 50 are known from the prior art. Reference number 180 indicates a space between two reflectors, e.g. between reflectors 142 and 143.

All optical elements shown in FIG. 2 (and optical elements not shown in the schematic drawing of this embodiment) are vulnerable to deposition of contaminants produced by source SO, for example, Sn. This is the case for the radiation collector 50 and, if present, the grating spectral filter 51. Hence, the cleaning device according to the invention may be used to clean one or more of these optical elements as well as the cleaning method of the present invention may be applied to those optical elements, but also to normal incidence reflectors 53, 54 and reflective elements 58, 59 or other optical elements, for example additional mirrors, gratings, etc.

Radiation collector 50 may be a grazing incidence collector. The collector 50 is aligned along an optical axis 0. The source SO or an image thereof is located on optical axis O. The radiation collector 50 may include reflectors 142, 143, 146 (also known as a Wolter-type reflector including several Wolter-type reflectors). Sometimes they are also called a shell. These reflectors 142, 143, 146 may be nested and rotationally symmetric about optical axis O. In FIG. 2 (as well as in other figures), an inner reflector is indicated by reference number 142, an intermediate reflector is indicated by reference number 143, and an outer reflector is indicated by reference number 146. The radiation collector 50 encloses a certain volume, i.e. the volume within the outer reflector(s) 146. Usually, this volume within outer reflector(s) 146 is circumferentially closed, although small openings may be present. All the reflectors 142, 143 and 146 include surfaces of which at least part includes a reflective layer or a number of reflective layers. Hence, reflectors 142, 143 and 146 (more reflectors may be present and are included herein), include at least part designed for reflecting and collecting EUV radiation from source SO, and at least part of the reflector may not be designed to reflect and collect EUV radiation. For example, at least part of the back side of the reflectors may not be designed to reflect and collect EUV radiation. The latter part may also be called back side. On the surface of these reflective layers, there may in addition be a cap layer for protection or as optical filter provided on at least part of the surface of the reflective layers.

The radiation collector 50 may be placed in the vicinity of the source SO or an image of the source SO. Each reflector 142, 143, 146 may include at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

During use, on one or more of the outer 146 and inner 142/143 reflector(s) deposition may be found, especially Sn when a Sn source SO is used. Deposition of Sn, for example due to a Sn source, may, after a few mono-layers, be detrimental to reflection of the radiation collector 50 or other optical elements, which may necessitate the cleaning of such optical elements. Detrimental herein refers to reduction and loss of reflectivity of those reflecting surfaces of the reflector or mirror that is designed to reflect (and/or collect) radiation. Further, deposition of carbon may be found.

Deposition, especially deposition including Sn, may be removed in an embodiment by halogens (as gasses), for example, $F_2$, $Cl_2$, $Br_2$ and $I_2$ and, in another embodiment by hydrogen radicals, and in yet a further embodiment by combinations of hydrogen radicals and one or more halogens, either applied simultaneously or subsequently. In case there is a deposition with e.g. Sn, due to the presence of small amounts of oxygen, there will usually also be to some extent Sn oxide. To remove Sn oxides, a reduction step may be necessary before elemental Sn can be removed in an embodiment with a halogen gas by the formation of halogenides, followed by a removal of the reduced oxide with hydrogen radicals with the formation of hydrides. Hence, hydrogen radicals, either for reduction or for removal have to be provided to at least part of a surface of collector 50, or at least part of a surface to be cleaned of other optical elements. Such surfaces are e.g. the EUV reflecting surfaces of reflectors 142, 143 and 146 which are contaminated with deposition like Sn. Further, hydrogen radicals may be used to remove carbon deposition by formation of volatile hydrocarbons.

Referring to FIGS. 1 and 2, different modules may have to be at least partially cleaned from e.g. Sn and/or C deposition. In an embodiment, a module, indicated with reference number 201, is selected from the group of a collector 50, radiation system 42 (also known as source collector module), illumination system IL and projection system PS (also known as projection optics box POB). In an embodiment, the module to be cleaned may also be a grating spectral filter 51. In yet another embodiment, the module to be cleaned may also be a mask, in particular a reflective multilayer mask.

Cleaning of lithographic apparatus module 201 and the cleaning of arrangement 250 are elucidated with reference to collector 50 only, wherein collector 50 includes at least a plurality of reflectors as described above. However, the cleaning arrangement 250 as depicted in FIGS. 3a-3d can also be used for cleaning of other modules 201, like at least part of the whole radiation system 42, at least part of the illumination system IL and at least part of the projection system PS. In an embodiment, the module to be cleaned may also be a grating spectral filter 51, or a mask, in particular a reflective multilayer mask. Hence, the term "through a module" refers to either to the module to be cleaned or to a module containing a device to be cleaned. For example, optical elements 50 (collector), 51 (grating spectral filter), 53 and 54 may be cleaned by leading a hydrogen radical containing gas flow over such optical element through at least part of the module containing such optical element (radiation system 42 and illumination system IL, respectively).

For cleaning, for example, collector 50, the collector may be contained in a separate module (not depicted), e.g. by providing doors to ends 50a and 50b (not depicted), and providing to the volume contained by the doors and collector 50 a cleaning gas and removing gas from the volume or by including collector 50 in a reactor vessel. Such a cleaning may be performed in situ or ex situ of the lithographic apparatus.

Collector 50 may also be cleaned by providing cleaning gas to at least part of one of both sides 50a and 50b of collector 50, i.e. providing cleaning gas to radiation system 42 (or source collector module 42). Embodiments are shown in FIGS. 3a-3d, wherein collector 50 contained in radiation system 42 can be cleaned by using cleaning arrangement 250.

The cleaning arrangement 250 for the lithographic apparatus module collector 50 includes a cleaning device 95 configured to provide a hydrogen radical containing gas to at least part of the module, here to at least part of collector 50, and at least a pump 300 or 400 configured to pump or to exhaust the gas through collector 50 such that a flow speed of the hydrogen radical containing gas is provided through at least part of the module of at least 1 m/s. Each pump 300 or 400 may include a number of pumps (i.e. a series of pumps). Cleaning arrangement 250 includes at least one of pumps 300 and 400, but may also include two or more pumps, for example cleaning arrangement 250 may include pumps 300 and 400. The gas flow through collector 50 is indicated with reference symbol 96. As should be appreciated, the direction of the gas flow may also be chosen differently. For example, outlet 106 of cleaning device 95 may be configured to provide a hydrogen radical containing gas at side 50b of collector 50. Pumps 300 and/or 400 may then be configured such that the gas flow through collector 50 is in the opposite direction as drawn in FIGS. 3a-3d. An exhaust 206 (or plurality of outlets) may be configured at a suitable position, depending upon the position of opening(s) 106.

In an embodiment, cleaning arrangement 250 further includes a gas shutter 330 configured to modulate (which may include a complete interruption) a flow 196 of the hydrogen radical containing gas to at least part of the module. By opening or closing shutter 330, flow 196 of the hydrogen radical containing gas can be controlled, e.g. to provide a step wise or cyclic pressure regime, as indicated below. Gas shutter 330 may be provided at opening 106 of flow tube 104, it may be configured within flow tube 104, and gas shutter 330 may also be configured upstream of hydrogen radical source 103 (as shown in FIGS. 3a-3d). Here flow 196 of the hydrogen radical containing gas refers to the gas flow which is exhausted at outlet 106 as hydrogen radical containing gas, and which is based on flow 100 and processed in hydrogen radical generator 103. This means that gas shutter 330 can modulate the production of the hydrogen radical containing gas and can thereby, together with pump 300 and/or 400 also modulate gas flow 96 through the module, i.e. in this embodiment through collector 50.

Cleaning arrangement 250 includes cleaning device 95, including a hydrogen radical source 103. Hydrogen radical source 103 includes an inlet 101 for the $H_2$ containing gas 100, for example an $H_2$ flow. A suitable source (indicated in FIG. 3d with reference number 700) may be provided for the $H_2$ containing gas 100. Hydrogen radical source 103 further includes one or more units 110 designed to convert at least part of the $H_2$ gas into hydrogen radicals. In an embodiment, hydrogen radical source 103 includes one or more hydrogen radical producing sources 110 selected from the group of one or more oscillating field electrodes, a magnetron RF generator and one or more hot filaments. In an embodiment, the hot filament 110 can be e.g. a W (tungsten) or Ta (tantalum) wire or coil (or other suitable material), which can be heated to e.g. 1500-3000 K or even above, depending upon the kind of material and desired temperature and required temperature to dissociate the chemical bonds of $H_2$ of at least part of all $H_2$ molecules in the $H_2$ containing gas 100. For example, a plasma may be generated by one or more electrodes 110, such that hydrogen radicals are created. A high voltage, e.g. about 5-10 kV, between two electrodes, thereby forming a plasma, can be used. It should be appreciated that pumps, $H_2$-containing gas reservoirs, etc. configured to provide the $H_2$ containing gas (flow) to hydrogen radical source 103 may also be present (but are not depicted). Due to the presence of one or more hydrogen radical forming units 110, at least part of the $H_2$ in flow 100 is converted into H-radicals, thereby providing a hydrogen radical containing gas. At least part of this hydrogen radical containing gas leaves hydrogen radical source 103 and enters flow tube 104. As a result of the flow input to inlet 101, there is a driving force of the hydrogen radical containing gas towards opening 106. This opening may be positioned at a predetermined position within an apparatus, e.g. lithographic apparatus 1. Then, at this predetermined position, the hydrogen radicals may contribute to a cleaning process of at least part of a surface of the optical element.

In an alternative embodiment, hydrogen radical source 103 may be configured within the module to be at least partially cleaned. For example, collector 50 may include one or more hydrogen radical sources 103 instead of or in addition to hydrogen radical source 103 in cleaning device 95. The flow of hydrogen gas from flow tube 104 through the module is then converted in hydrogen containing gas flow 96 within the collector (or another module, if applied in another module).

The gas flow 96 through collector 50 may be such that for example flow 96 is only provided between two reflectors, for example between reflectors 143 and 142, etc. or only through the central reflector 142, as schematically indicated in FIGS.

3a-3d. However, cleaning device 95 may include a plurality of outlets 106 or one or more large outlets 106, such that (substantially) the entire volume enclosed by outer reflector 146 can be filled with the hydrogen radical containing gas.

Figure 3A:
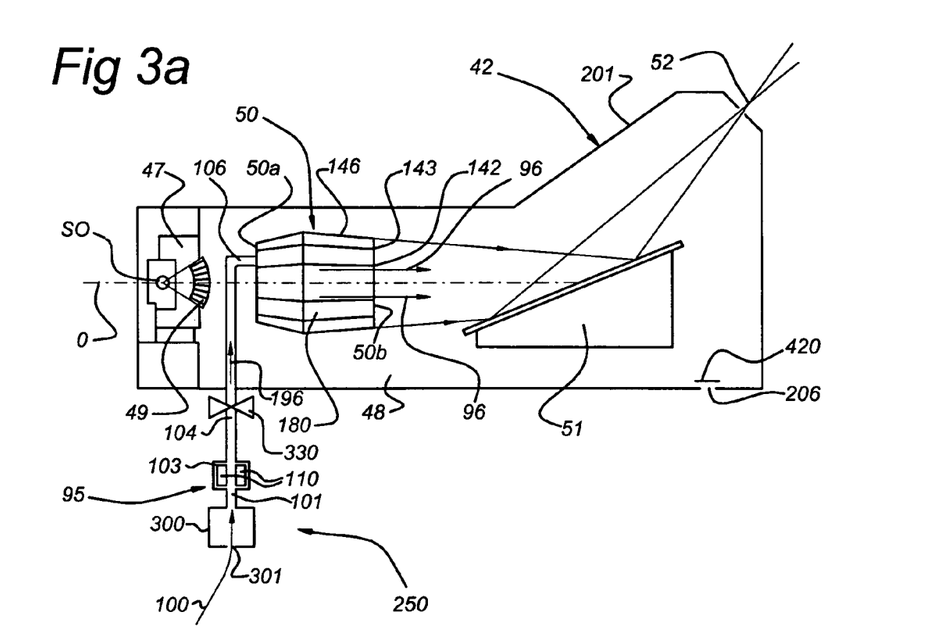
FIGS. 3a-3d schematically depict embodiments and variants thereof of the collector in a radiation system and cleaning arrangement according to the invention.
Figure 3B:
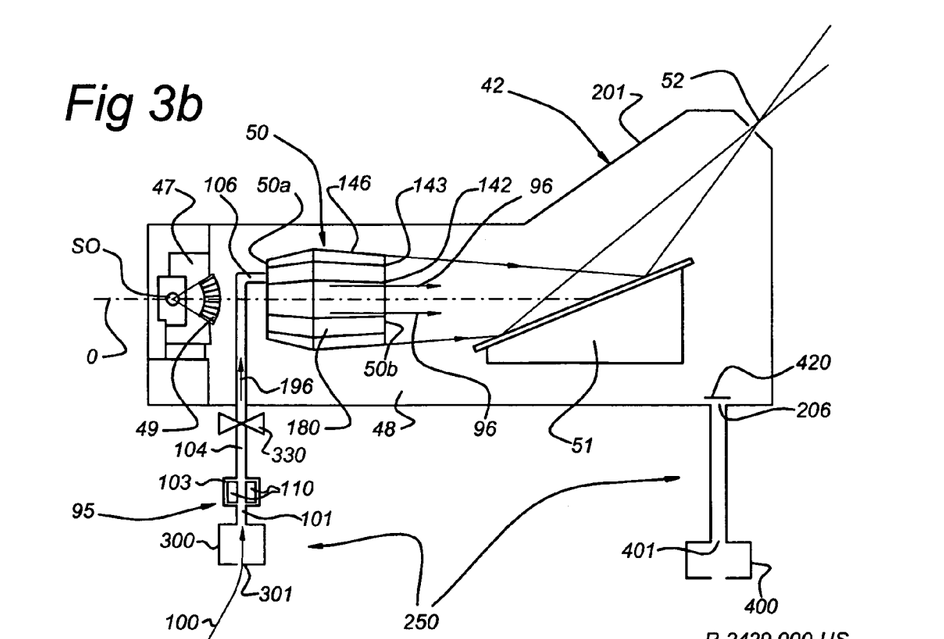

Gas flow 96 may be achieved in one embodiment by providing cleaning arrangement 250 including pump 300 configured to provide hydrogen radical containing gas flow 96 of at least 1 m/s, wherein pump 300 is configured upstream of the hydrogen radical source 103 (blowing arrangement), as schematically depicted in FIG. 3a. In an alternative embodiment, cleaning arrangement 250 includes pump 400 configured to provide hydrogen radical containing gas flow 96 of at least 1 m/s, wherein pump 400 is configured downstream of the module (here collector 50) (exhaust arrangement), as depicted in FIG. 3b. In this embodiment, pump 300 may be absent or may be a small pump, providing the hydrogen containing gas flow 100 that is formed into a flow 96 through collector 50 by exhaust pump 400. In yet an alternative embodiment, cleaning arrangement 250 includes two pumps (or two series of pumps), a blower pump 300 and an exhaust pump 400. In this way, flow 96 can be provided according to the invention.

In yet another embodiment, cleaning is performed from both sides of collector 50. For example, opening 106 is configured such that hydrogen radical flow 96 is provided from opening 50a to 50b, and subsequently, opening 106 is configured such that hydrogen radical flow 96 is provided from opening 50b to 50a. To that end, a number of outlets 106 and/or exhausts 420 may be present at suitable positions to obtain the desired flow 96. By using the flow speed of at least 1 m/s, a substantial part of the reflector surface (i.e. of the module surface) to be cleaned can be cleaned by hydrogen radicals, whereas by using smaller speeds, the time that the hydrogen radicals have to travel to reach the entire reflector surface to be cleaned is too long and recombination may occur. This may be three-body recombination (H+H+H$_2$→2H$_2$) or recombination at a surface (like reflector or back side of reflector)(H+Sw (surface wall)→H–Sw; H+H–Sw→H$_2$+Sw).

In another embodiment, a method is provided wherein the flow speed of flow 96 through the module (here collector 50) is at least 5 m/s and in yet another embodiment at least 10 m/s. The gas flow speed may be between about 1 m/s and 100 m/s, in a further embodiment between about 5 m/s and 100 m/s; in an even further embodiment between about 10 and 100 m/s.

In this way, there is provided a method for cleaning a lithographic apparatus module, for example collector 50, by leading a hydrogen radical containing gas flow 96 through at least part of the module with a flow speed of at least 1 m/s, by maintaining in the module a gas atmosphere having a gas pressure between 1 mbar (100 Pa) and 1000 mbar (100,000 Pa), and further in a specific embodiment a hydrogen radical partial pressure between 0.001 and 10% of the total pressure, for a predetermined time. In yet a specific embodiment, the gas pressure is between 5 and 500 mbar. Herein "gas pressure", or "gas pressure in a module" refers to the total gas pressure of the gas in the module, whereas the hydrogen radical partial pressures only refer to the partial pressure of the hydrogen radicals in the gas. Cleaning arrangement 250 may be configured to provide such method for cleaning a lithographic apparatus module.

In yet another embodiment, the hydrogen radical partial pressure is between $1 \cdot 10^{-5}$ (0.001 Pa) and 10 mbar (1000 Pa) and in a variant, between $1 \cdot 10^{-4}$ (0.01 Pa) and 1 mbar (100 Pa). In a further variant, the hydrogen radical partial pressure is between $1 \cdot 10^{-3}$ (0.1 Pa) and 0.1 mbar (10 Pa).

Figure 3C:
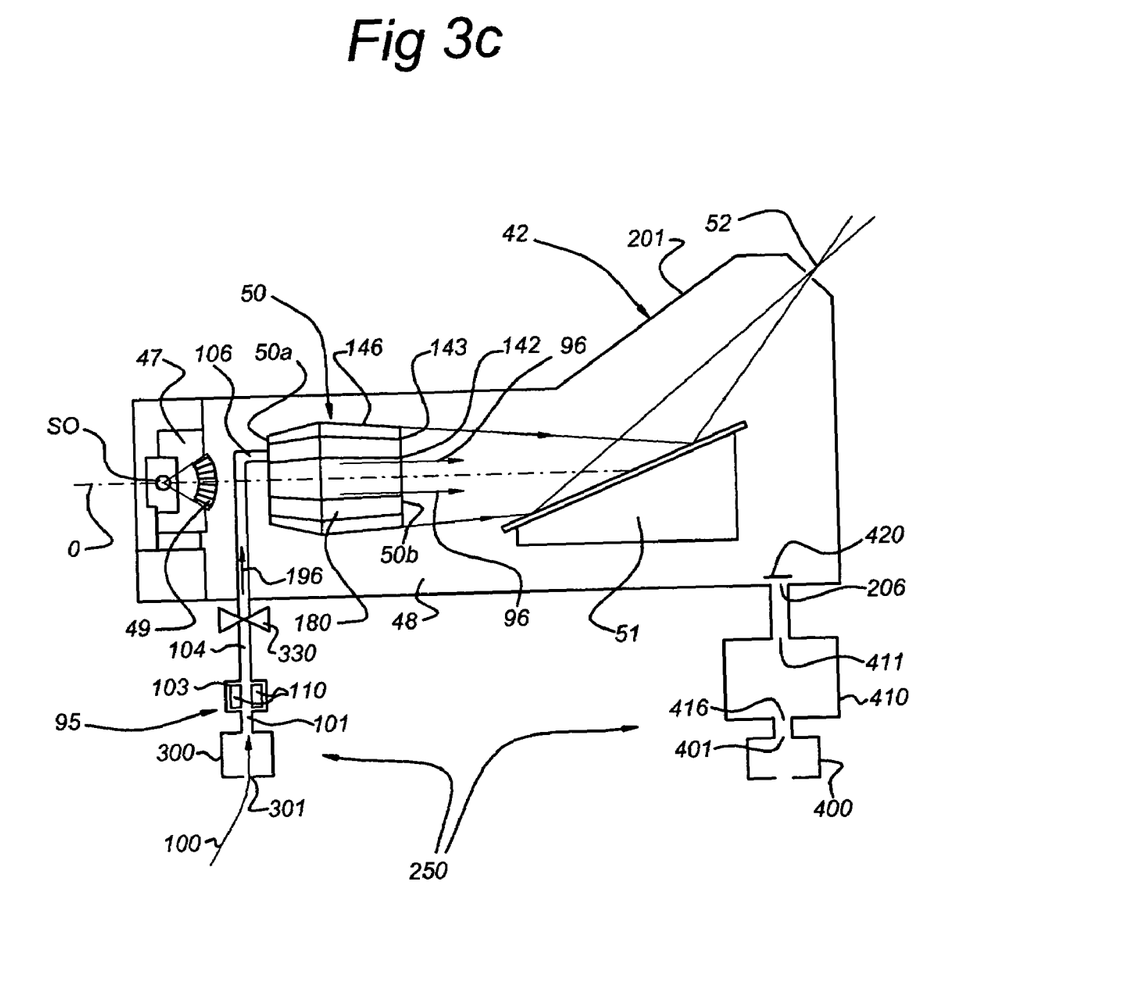
Figure 3D:
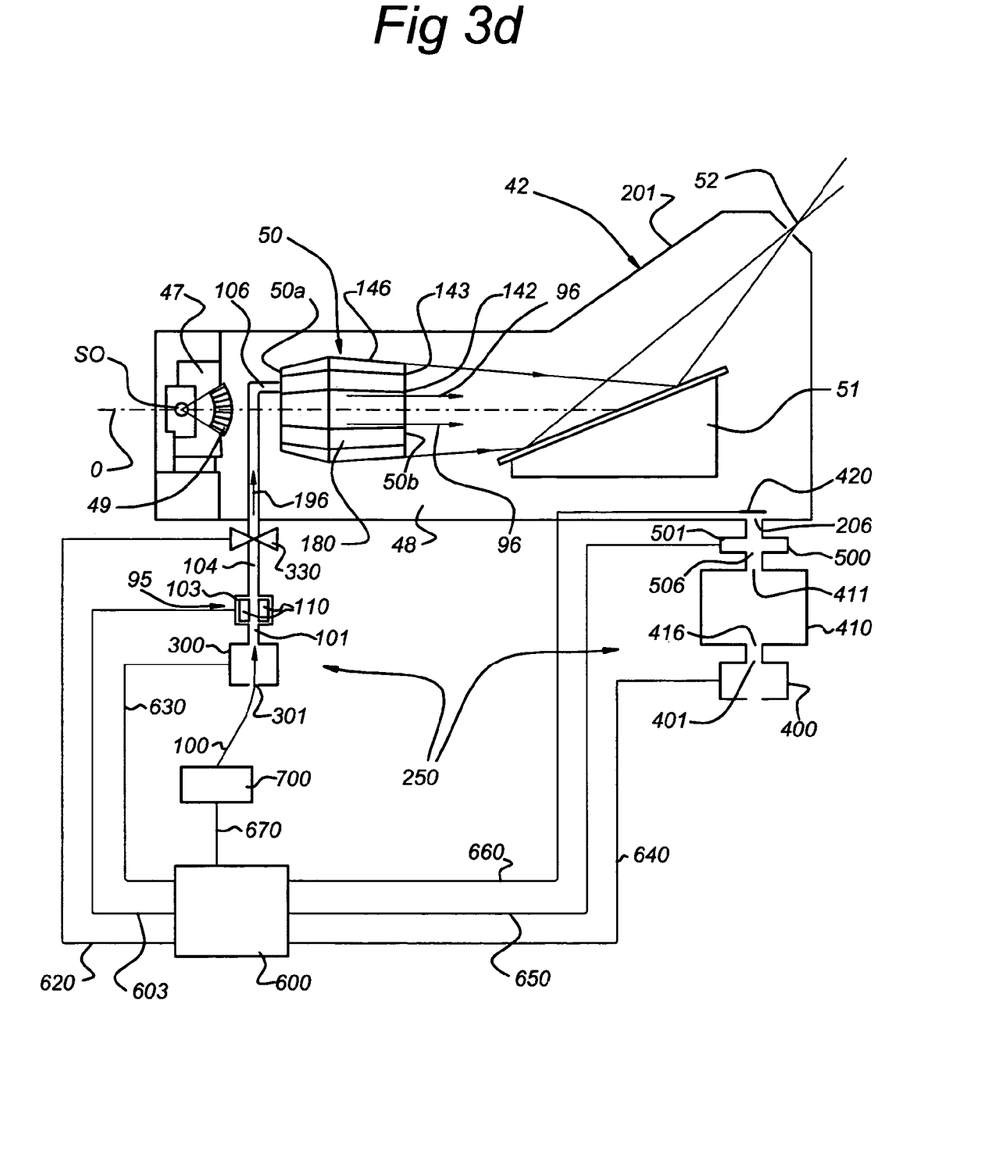

In a further embodiment, the gas contained in the module is pumped away to a buffer volume 410 of at least 1 m$^3$. Gas contained in the module can flow via exhaust 206 and inlet 411 to buffer volume 410 (FIGS. 3c and 3d). During lithography, buffer volume 410 may be evacuated for a next cleaning. In an embodiment, shutter 420 may be closed and buffer volume 410 can be evacuated by pump 400. Buffer volume 410 may be maintained at a low pressure, such that when the cleaning process is started, a hydrogen radical flow 96 may be generated (and modulated, see also above) when providing hydrogen radical gas by cleaning device 95, wherein flow is from outlet 106 from cleaning device 95 through the module (here collector 50) to buffer volume 410. The input of hydrogen radical gas and the pressure of the buffer volume can be chosen such that the desired flow is obtained. In a specific embodiment buffer volume 410 has a volume of at least 10 m$^3$. The initial pressure (i.e. before performing the cleaning method of the invention) of buffer volume 410 may in another embodiment be between about 0.001 mbar and 1 mbar. In a variant, the initial pressure of the buffer volume 410 is between about 0.001 mbar and 0.1 mbar.

Figure 4:
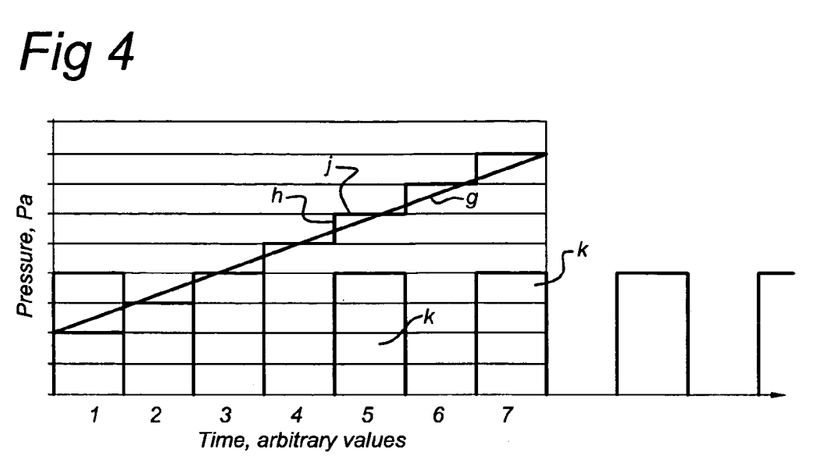
FIGS. 4-6 depict possible cleaning schemes.
Figure 5:
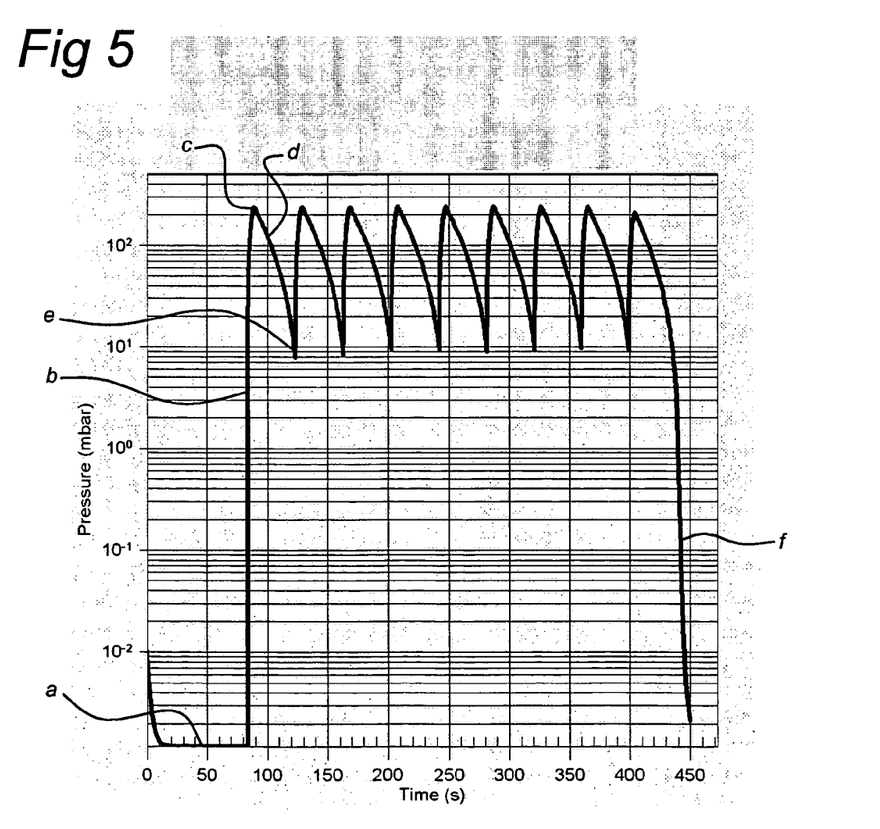

Now, referring to the embodiments described above, different cleaning schemes can be used as schematically depicted in FIGS. 4 and 5. FIG. 4 shows the pressure (i.e. the total pressure) in the module (for example collector 50, radiation system 42, illumination system IL or projection system PS) as function of time (arbitrary units). A discontinuous regime with a repetition of cycles k can be chosen. A continuous regime with a constant increasing pressure within the module can be chosen, as indicated with reference g. Combinations may also be chosen, for example a stepwise increase in the pressure, with increasing steps h and time periods j wherein the pressure in the module is constant.

In a further embodiment, a method is provided wherein the pressure in the module, especially the collector 50 is periodically varied between a lower and a higher pressure selected from the pressure range between 1 mbar and 1000 mbar. In a further variant, the pressure in the module is periodically varied between a lower and a higher pressure selected from the pressure range between 5 mbar and 500 mbar.

An example is shown in FIG. 5. The hydrogen radical containing gas flow 96 is provided to at least part of the module in cycles, a cycle including a pressure build up (b) until a first pressure (c) in the module of 1000 mbar or smaller is reached, and a pressure decrease (d) in the module wherein the hydrogen radical containing gas flow 96 is stopped until a pressure (e) in the module of 1 mbar or larger is reached. In this way, while maintaining effective cleaning pressures in the module between about 1 and 1000 mbar, an effective flow speed (gas flow 96) of at least 1 m/s can at least be provided during at least part of rise or pressure build up (b) an at least part of pressure decrease (d). By repeating the cycle, each repetition provides a certain time frame in which the speed of at least 1 m/s may be reached.

The total cleaning time, i.e. the predetermined time may be between 10 s and 120 minutes.

The behavior shown in FIG. 5 may be in an embodiment achieved by providing a cleaning arrangement 250 including cleaning device 95, buffer volume 410 and pump 400. Before the cleaning process is started, the buffer volume is evacuated to a pressure below about 1 mbar, more specifically below about 0.1 mbar. A hydrogen radical containing gas is provided by cleaning device 95 when shutter 330 is opened. Due to the large suction, the desired flow is obtained during a steep increase (b) of the pressure in the module. At a certain pressure (c), about 1000 mbar, three body recombination may become too strong, leading to a loss of hydrogen radicals, such that the pressure has to be lowered. The gas input from cleaning device 95 may be substantially diminished or stopped using shutter 330 (opening 106 may be closed or no hydrogen gas 100 is fed to cleaning device 95, etc., see also above) and pump 400 pumps gas from the module and the gas pressure in the module lowers (d). For evacuating the module, pump 400 may be used; alternatively a pump 500 may be used, with inlet 501 in communication with outlet 206 and outlet 506 in communication with inlet 411 of buffer volume 410. However, alternatively, or in addition to pumps 400 and or 500, a separate pump may be used.

The cleaning regimes as described above, in particular as indicated in FIG. 5, may be applied for cleaning collector 50 including a plurality of reflectors (as indicated in FIG. 2; such collector 50 is also known as "Wolter type collector"). The cleaning regime may in an embodiment be efficient between 1 and 1000 mbar. Hence, when having reached a lower pressure (e) in the module, for example between about 1 and 100 bar, the influx of a hydrogen containing gas can start again by opening shutter 330, leading to a new flow 96 through collector 50 to the in the mean time at least partly evacuated buffer volume 410. This procedure may be repeated several cycles (as indicated in FIG. 5 with 9 cycles, each cycle having a pressure rise (b) and pressure decrease (d)) until enough Sn and/or C has been removed, and the pressure in the module can decrease again (f) and lithographic processing may continue.

In an embodiment, pump 400 (and optional pump 500) is pumping in overload while the hydrogen radical containing gas is provided during the pressure rise (b) of one or more cycles. After stopping or substantially diminishing the supply of the hydrogen containing gas at (c) (by at least partially closing shutter 330), the pressure decreases (d) due to pumping at exhaust 206 and pump 400 may recover.

In another embodiment, there is provided a cleaning arrangement 250 further including a buffer volume 410 of at least 1 m³ configured downstream of the module, more specifically of at least 10 m³. The cleaning arrangement 250 includes a pump 400 configured to provide hydrogen radical containing gas flow of at least 1 m/s (through the module), wherein the pump 400 is configured downstream of the buffer volume 400 (as indicated in FIG. 3c).

During the cleaning process or as part of the cleaning process, in an embodiment the method of the invention further includes providing a halogen gas to the module. In this way, reduced oxides may be removed as volatile halides, e.g. Sn-halides.

According to yet a further aspect of the invention, a lithographic apparatus including the cleaning arrangement as described above in a number of embodiments is provided.

In a variant, and referring to FIGS. 3c and 3d, there is provided a cleaning arrangement 250 for a lithographic apparatus module (wherein the module is selected from the group of a collector 50, a radiation system 42, an illumination system IL and a projection system PS) including a hydrogen radical source 103 configured to provide a hydrogen radical containing gas to at least part of the module; a buffer volume 410 of at least 1 m³ in communication with the module; and a pump 400 configured to provide a gas pressure in the buffer volume between 0.001 mbar (0.1 Pa) and 1 mbar (100 Pa). In an embodiment, pump 400 is configured to provide a gas pressure in buffer volume 410 below 0.1 mbar (10 Pa), and in yet another embodiment, buffer volume 410 has a volume of at least 10 m³. In a specific embodiment, there is provided a lithographic apparatus 1 including cleaning arrangement 250 according to the invention.

In an embodiment, a gas shutter 420 is provided in between the module and the buffer volume 410. Again, this embodiment is described with reference to collector 50 as lithographic apparatus module. Since collector 50 as module is contained in larger radiation system 42, for example buffer volume 410 is in communication with collector 50 due to the fact that there is an opening 420 in radiation system 42.

Cleaning of a lithographic apparatus module and cleaning arrangement 250 are elucidated with reference to collector 50 only. However, the cleaning arrangement 250 as depicted in FIGS. 3c-3d can also be used for cleaning at least part of the whole radiation system 42, at least part of the illumination system IL and at least part of the projection system PS.

At relatively small pressures, i.e. below about 10 mbar (1000 Pa), the load on pumps may be quite significant. To make it possible to use the complete range of pressure regimes in an embodiment an always evacuated buffer volume 410 available for cleaning is provided. Cleaning is not a permanent process but is being applied each time when reflectivity loss is reached. When cleaning has to be performed the gas flow 96 may fill the buffer volume 410 independent from pump capacity (e.g. from pump 400). The pressure increase can be applied continuously as well (see also below). After cleaning is ended, buffer volume 410 can be evacuated during normal performance of lithographic apparatus 1 for a next cleaning process when e.g. reflectivity loss is high again. For example, during exposure, shutter 420 may be closed and buffer volume 410 can be evacuated to obtain the desired pressure.

According to an aspect, there is provided a method for cleaning a lithographic apparatus module (here collector 50) including pressurizing a buffer volume 410 of at least 1 m³ in communication with collector 50 (note that this implies in these embodiments as schematically depicted in FIGS. 3a-3d: in communication with radiation system 42), at a gas pressure between 0.001 mbar (0.1 Pa) and 1 mbar (100 Pa); providing a hydrogen radical containing gas to at least part of collector 50 (for example by opening shutter 330); and maintaining in collector 50 (i.e. here at least part of radiation system 42 since collector 50 is contained in radiation system 42) the gas pressure between 0.001 mbar (0.1 Pa) and 1000 mbar (100,000 Pa) for a predetermined time. Optionally, gas shutter 420 may be present. Cleaning arrangement 250 may be configured to provide such method for cleaning a lithographic apparatus module.

According to another aspect, there is provided a method for cleaning a lithographic apparatus module (here collector 50) including pressurizing a buffer volume 410 of at least 1 m³ in communication with collector 50, and separated by gas shutter 420 in between collector 50 and the buffer volume 410, at a gas pressure between 0.001 mbar (0.1 Pa) and 1 mbar (100 Pa); providing a hydrogen radical containing gas to at least part of collector 50; opening shutter 420 between collector 50 and buffer volume 410; and maintaining in collector 50 the gas pressure between 0.001 mbar (0.1 Pa) and 1000 mbar (100,000 Pa) for a predetermined time. Cleaning arrangement 250 may be configured to provide such method for cleaning a lithographic apparatus module.

In an embodiment, a hydrogen radical partial pressure in the module 201 (i.e. in these embodiments collector 50) is maintained between 0.001 and 10% of the total pressure, for a predetermined time.

In another embodiment, the gas pressure (i.e. the total pressure) in collector 50 (i.e. also in at least part of radiation system 42) is maintained between 0.001 mbar (0.1 Pa) and 100 mbar (10000 Pa) for a predetermined time. In an even more specific variant the gas pressure in collector 50 is maintained between 0.01 mbar (1 Pa) and 10 mbar (1000 Pa) for a predetermined time. Such a variant may especially also be applied when cleaning so called open systems like radiation system 42, an illumination system IL and a projection system PS.

Figure 6:
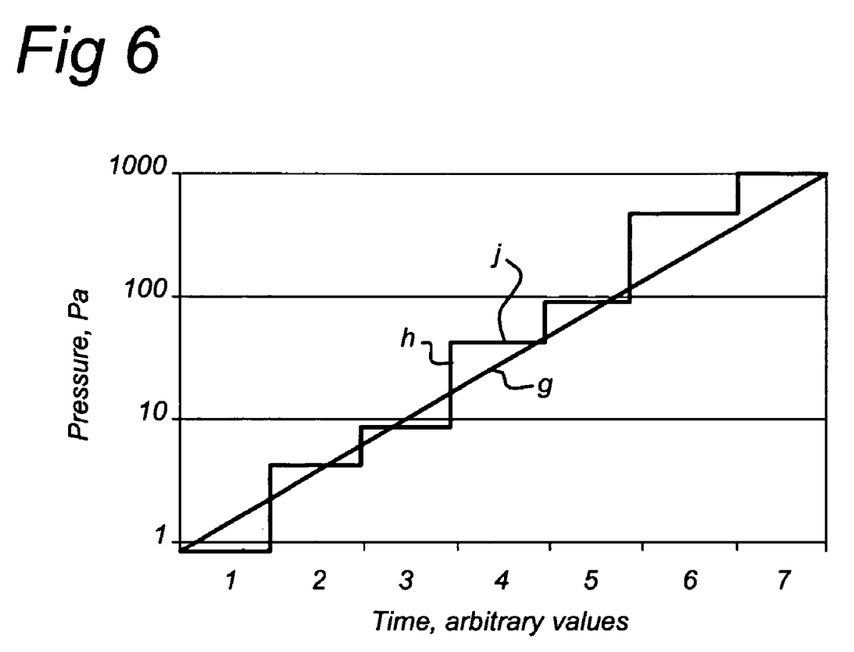

Examples of possible cleaning regimes are indicated in FIGS. 4-6, wherein the pressure is indicated as function of time (arbitrary units): stepwise as indicated with references (h) and (j) or continuous (g). Note that FIGS. 4 and 6 are only schematic drawings and the curves shown schematically indicate the (possibly) followed pressure regime(s). In reality the curves and steps may be more smooth with less abrupt pressure changes (h/j).

Hence, according to an aspect of the invention, a method is provided wherein the pressure in collector 50 is stepwise (h,j) increased between a lower and a higher pressure selected from the pressure range between 0.001 mbar (0.1 Pa) and 100 mbar (10000 Pa), more specifically between a lower and a higher pressure selected from the pressure range between 0.01 mbar (1 Pa) and 10 mbar (1000 Pa), as e.g. indicated in FIG. 6. In a specific embodiment, a method is provided, wherein the pressure in collector 50 is periodically varied in cycles (k) between a lower and a higher pressure selected from the pressure range between 0.001 mbar (0.1 Pa) and 100 mbar (10000 Pa), more specifically between a lower and a higher pressure selected from the pressure range between 0.01 mbar (1 Pa) and 10 mbar (1000 Pa), as e.g. indicated in FIG. 4. In yet another embodiment, a method is provided, wherein the pressure in collector 50 is continuously (g) increased between a lower and a higher pressure selected from the pressure range between 0.001 mbar (0.1 Pa) and 100 mbar (10000 Pa), more specifically between a lower and a higher pressure selected from the pressure range between 0.01 mbar (1 Pa) and 10 mbar (1000 Pa), as e.g. indicated in FIGS. 4 and 6. More than one cycle with a continuous increase (g) may be performed during the cleaning method of the invention.

When pressures larger than about 0.1 mbar (1 Pa), more specifically 1 mbar (10 Pa) are reached, in an embodiment cleaning arrangement 250 is configured such that the gas flow speed of the hydrogen radical containing gas through collector 50 is least part of collector 50 of at least 1 m/s.

In an embodiment, a method is provided wherein the hydrogen radical containing gas flow is provided to at least part of collector 50 in cycles, a cycle including a pressure build up (b) until a first pressure (c) in collector 50 of 100 mbar (10000 Pa) or smaller is reached; and a pressure decrease (d) wherein the hydrogen radical containing gas flow is stopped until a pressure (e) in collector 50 of 0.001 mbar (0.1 Pa) or larger is reached, more specifically 0.01 mbar (1 Pa) and 10 mbar (1000 Pa), as indicated in FIGS. 4 and 5 (assuming a modified y axis to 0.001-100 mbar, or more specifically 0.01-10 mbar). As shown in the figures, a plurality of cycles may be applied during the cleaning method in order to remove Sn (reduce Sn-oxides) and/or C.

However, according to another aspect of the invention, a higher pressure regime is used: a pressure range between about 0.001 mbar (0.1 Pa) and 1000 mbar (100,000 Pa), more specifically between about 0.01 and 1000 mbar, even more specifically between about 0.1 and 1000 mbar, yet more specifically between about 1 and 1000 mbar (see also embodiments described above). The pressure in collector 50 is periodically varied between a lower and a higher pressure selected from the pressure range between 1 mbar and 1000 mbar. In a further variant the pressure in collector 50 is periodically varied between a lower and a higher pressure selected from the pressure range between 5 mbar and 500 mbar. Especially, the hydrogen radical containing gas flow may be provided to at least part of collector 50 in cycles, a cycle including a pressure build up (b) until a first pressure (c) in collector 50 of 1000 mbar or smaller is reached; and a pressure decrease (d) wherein the hydrogen radical containing gas flow is stopped until a pressure (e) in collector 50 of 1 mbar or larger is reached.

Such relative high pressure variants may be applied when cleaning so called open systems like a radiation system 42, an illumination system IL and a projection system PS, but are in an embodiment especially suitable for cleaning of collector 50 including a plurality of reflectors (as indicated in FIG. 2; such collector 50 is also known as "Wolter type collector")

A continuous cleaning regime may be obtained by providing a continuous flow of the hydrogen radical containing gas. Optionally, gas from collector 50 may be pumped away, e.g. via pump 400. By providing an intermittent flow of the hydrogen radical containing gas by cleaning device 95, a step wise increase (h,j) may be obtained. By providing an intermittent flow of the hydrogen radical containing gas by cleaning device 95, and after each cycle pumping away gas from collector 50, a discontinuous regime (with cycles k) as depicted in FIG. 4 may be obtained. The regime as schematically depicted in FIG. 5, may also be applied, and is described above. Combinations of such regimes are possible.

During the cleaning process or as part of the cleaning process, in an embodiment the method of the invention further includes providing a halogen gas to collector 50. In this way, reduced oxides may be removed as volatile halides, e.g. Sn-halides.

FIG. 3d further schematically depicts a controller 600, like a computer or processor, in an embodiment controlled by a computer program product, and configured and designed to control the cleaning method according to the invention. Controller 600 may be configured and designed to control one or more of pumps 300, 400 and 500, shutters 330 and 420, hydrogen source 700 and hydrogen radical generator 103. This controller 600 may also be used in other embodiments, as for example schematically depicted in FIGS. 3a-3c, and may be used to provide the cleaning regimes as depicted in FIGS. 4-6. However, for the sake of simplicity, the embodiment of the controller is only shown in FIG. 3d. Further, in embodiments wherein less devices are present than depicted in FIG. 3d (FIGS. 3a-3c), controller 600 may control the devices as far as the devices are present in the embodiment. For example, referring to the embodiment schematically depicted in FIG. 3c, controller 600 may control one or more of the devices pumps 300 and 400, shutters 330 and 420, hydrogen source 700 (not depicted) and hydrogen radical generator 103. Driving signals and device signals may be exchanged. This communication with and/or from controller 600 is indicated with connection 670 to hydrogen source 700, connection 630 to pump 300, connection 603 to hydrogen radical generator 103, connection 620 to gas shutter 330, connection 640 to pump 400, connection 650 to pump 500 and connection 660 to shutter 420. Further, other shutters, gas flow controllers, pressure detectors, other detectors, etc., may be present, and may be controlled or may be used to control one or more of pumps 300, 400 and 500, shutters 330 and 420, hydrogen source 700 and hydrogen radical generator 103 to provide the desired cleaning method of the invention.

The invention is not limited to EUV radiation alone, but may also be used for lithographic apparatus that use other radiation, as described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus, it will be apparent to one skilled in the art that modifications may be made to the invention as described without departing from the scope of the claims set out below.

What is claimed is:

1. A cleaning arrangement for a lithographic apparatus module, comprising:
   a pump configured to pump a hydrogen radical containing gas through the module such that a flow speed of the hydrogen radical containing gas provided through at least part of the module is at least 1 m/s.

2. The cleaning arrangement according to claim 1, wherein the module is selected from the group of a collector, a radiation system, an illumination system and a projection system.

3. The cleaning arrangement according to claim 1, further comprising a buffer volume of at least 1 $m^3$ configured downstream of the module.

4. The cleaning arrangement according to claim 3, wherein the buffer volume has a volume of at least 10 $m^3$.

5. The cleaning arrangement according to claim 1, wherein the pump is configured upstream of the module.

6. The cleaning arrangement according to claim 1, wherein the pump is configured downstream of the module.

7. The cleaning arrangement according to claim 3, wherein the pump is configured downstream of the buffer volume.

8. The cleaning arrangement according to claim 1, further comprising a gas shutter configured to modulate a flow of the hydrogen radical containing gas to at least part of the module.

9. A lithographic apparatus comprising a cleaning arrangement, the cleaning arrangement comprising a pump configured to pump a hydrogen radical containing gas through the module such that a flow speed of the hydrogen radical containing gas provided through at least part of the module is at least 1 m/s.

10. The lithographic apparatus according to claim 9, wherein the module is selected from the group of a collector, a radiation system, an illumination system and a projection system.

11. A method for cleaning a lithographic apparatus module, comprising:
    providing a hydrogen radical containing gas flow through at least part of the module with a flow speed of at least 1 m/s; and
    maintaining in the module a gas pressure between 1 mbar and 1000 mbar for a predetermined time.

12. The method according to claim 11, further comprising maintaining in the module a hydrogen radical partial pressure between 0.001 and 10% of the total pressure, for a predetermined time.

13. The method according to claim 11, wherein the module is selected from the group of a collector, a radiation system, an illumination system and a projection system.

14. The method according to claim 11, wherein the flow speed is at least 10 m/s.

15. The method according to claim 11, wherein the gas pressure is between 5 and 500 mbar.

16. The method according to claim 11, wherein the hydrogen radical partial pressure is between $1.10^{-4}$ mbar and 1 mbar.

17. The method according to claim 11, wherein the predetermined time is between 10 s and 120 minutes.

18. The method according to claim 11, wherein the gas contained in the module is pumped away to a buffer volume of at least 1 $m^3$.

19. The method according to claim 11, wherein the pressure in the module is stepwise increased.

20. The method according to claim 11, wherein the pressure in the module is periodically varied between a lower and a higher pressure selected from the pressure range between 5 mbar and 500 mbar.

21. The method according to claim 11, further comprising providing a halogen gas to the module.

22. A cleaning arrangement for a lithographic apparatus module, comprising:
    a gas shutter configured to modulate a flow of a hydrogen radical containing gas to at least part of the module;
    a buffer volume of at least 1 $m^3$ in communication with the module; and
    a pump configured to provide a gas pressure in the buffer volume between 0.001 mbar and 1 mbar.

23. The cleaning arrangement according to claim 22, wherein the pump is configured to provide a gas pressure in the buffer volume below 0.1 mbar.

24. The cleaning arrangement according to claim 22, wherein the module is selected from the group of a collector, a radiation system, an illumination system and a projection system.

25. The cleaning arrangement according to claim 22, wherein the buffer volume has a volume of at least 10 $m^3$.

26. A lithographic apparatus comprising a cleaning arrangement, the cleaning arrangement comprising a gas shutter configured to modulate a flow of a hydrogen radical containing gas to at least part of the module; a buffer volume of at least 1 $m^3$ in communication with the module; and a pump configured to provide a gas pressure in the buffer volume between 0.001 mbar and 1 mbar.

27. The lithographic apparatus according to claim 26, wherein the module is selected from the group of a collector, a radiation system, an illumination system and a projection system.

28. A method for cleaning a lithographic apparatus module, comprising:
 pressurizing a buffer volume of at least 1 m$^3$ in communication with the module at a gas pressure between 0.001 mbar and 1 mbar; and
 maintaining in the module a gas pressure of a hydrogen radical containing gas between 0.001 mbar and 1000 mbar for a predetermined time.

29. The method according to claim 28, further comprising maintaining in the module a hydrogen radical partial pressure between 0.001 and 10% of the total pressure, for a predetermined time.

30. The method according to claim 28, wherein the module is selected from the group of a collector, a radiation system, an illumination system and a projection system.

31. The method according to claim 28, the gas pressure in the module is maintained between 0.01 mbar and 10 mbar for a predetermined time.

32. The method according to claim 28, wherein the pressure in the module is stepwise increased.

33. The method according to claim 28, wherein the pressure in the module is periodically varied between a lower and a higher pressure selected from the pressure range between 0.01 mbar and 10 mbar.

34. The method according to claim 28, wherein the pressure in the module is in the pressure range between 5 mbar and 500 mbar.

35. The method according to claim 28, wherein the pressure in the module is periodically varied between a lower and a higher pressure selected from the pressure range between 5 mbar and 500 mbar.

36. The method according to claim 28, further comprising providing a halogen gas to the module.

37. The method according to claim 28, wherein the gas contained in the module is pumped away to the buffer volume.

* * * * *